(12) United States Patent
Belyaev et al.

(10) Patent No.: US 8,042,254 B1
(45) Date of Patent: Oct. 25, 2011

(54) METHOD FOR IMPROVING EDGE HANDLING CHUCK AERODYNAMICS

(75) Inventors: Alexander Belyaev, Mountain View, CA (US); Christian H. Wolters, Campbell, CA (US); Aleksey Petrenko, Milpitas, CA (US); Paul Doyle, San Jose, CA (US)

(73) Assignee: KLA-Tencor Corporation, San Jose, CA (US)

( * ) Notice: Subject to any disclaimer, the term of this patent is extended or adjusted under 35 U.S.C. 154(b) by 976 days.

(21) Appl. No.: 11/963,271

(22) Filed: Dec. 21, 2007

Related U.S. Application Data

(60) Provisional application No. 60/871,565, filed on Dec. 22, 2006.

(51) Int. Cl.
*B23B 31/18* (2006.01)
*B05C 13/00* (2006.01)

(52) U.S. Cl. ............ 29/559; 279/106; 269/20; 118/503; 118/730

(58) Field of Classification Search ............ 29/559; 279/106; 269/20; 118/500, 503, 728, 730; B23B 31/18; B05C 13/00
See application file for complete search history.

(56) References Cited

U.S. PATENT DOCUMENTS

| | | | | |
|---|---|---|---|---|
| 4,118,058 A | * | 10/1978 | Rahn et al. | 294/64.3 |
| 4,903,717 A | * | 2/1990 | Sumnitsch | 134/99.1 |
| 5,692,873 A | * | 12/1997 | Weeks et al. | 414/627 |
| 6,053,982 A | * | 4/2000 | Halpin et al. | 118/728 |
| 6,183,565 B1 | * | 2/2001 | Granneman et al. | 118/725 |
| 6,217,034 B1 | * | 4/2001 | Smedt et al. | 279/106 |
| 6,435,200 B1 | * | 8/2002 | Langen | 134/99.1 |
| 6,440,219 B1 | * | 8/2002 | Nguyen | 118/721 |
| 6,547,559 B1 | * | 4/2003 | Hodos | 432/253 |
| 6,641,672 B2 | * | 11/2003 | Nguyen | 118/721 |
| 6,702,302 B2 | * | 3/2004 | Smedt et al. | 279/106 |
| 6,761,362 B2 | * | 7/2004 | Noguchi | 279/106 |
| 7,115,169 B2 | * | 10/2006 | Nguyen | 118/721 |
| 7,172,674 B2 | * | 2/2007 | Engesser | 156/345.19 |
| 7,275,749 B2 | * | 10/2007 | Matsuzawa et al. | 279/106 |
| 7,284,760 B2 | * | 10/2007 | Siebert et al. | 279/4.12 |
| 7,607,647 B2 | * | 10/2009 | Zhao et al. | 269/21 |

* cited by examiner

*Primary Examiner* — Eric A Gates
(74) *Attorney, Agent, or Firm* — Joshua D. Isenberg; JDI Patent

(57) ABSTRACT

An edge-handling chuck, a system for holding and rotating a test substrate at a high speed and a method for chucking a rotating substrate are disclosed. The Chuck includes a plate having a central axis, a fluid opening and a top surface with a varied topography characterized by symmetry about the central axis. The topography is such that a volume flow rate of fluid between the fluid opening and a periphery of the top surface sufficient to counteract substrate sagging is significantly less than a volume flow rate needed for a similar but flat-surfaced chuck to similarly counteract such sagging. The system may further include a spindle motor and a gas system that supplies gas through the fluid opening to a gap between the top surface and a back surface of the substrate. A radial velocity of the fluid through the gap is approximately constant.

19 Claims, 9 Drawing Sheets

METHOD FOR IMPROVING EDGE HANDLING CHUCK AERODYNAMICS

CROSS-REFERENCE TO A RELATED APPLICATION

This application claims priority from co-pending provisional patent application Ser. No. 60/871,565, which was filed on Dec. 22, 2006, the entire disclosures of which are incorporated herein by reference.

FIELD OF THE INVENTION

This invention generally relates to an edge handling wafer chuck, and more particularly to an edge handling chuck with improved aerodynamics.

BACKGROUND OF THE INVENTION

Devices used to examine the surface of a semiconductor wafer commonly use a device known as an edge handling chuck to retain the wafer during inspection. Modern examination techniques often entail incrementally inspecting the surface of the wafer with a probe that moves radially while the wafer rotates, much like a phonograph needle passes over a phonograph record. As may be appreciated, the greater the speed of rotation, the larger the number of sample wafers which may be examined for a given time.

An edge handling chuck is one which simply secures the wafer at three or four or more fixed equidistant points at the wafer's periphery and holds the wafer at these fixed points during rotation. U.S. Pat. No. 6,217,034, which is incorporated herein by reference, describes an example of an edge handling chuck having a plate more or less cylindrical in shape that holds a wafer using multiple spring load edge wafer clamps. Air passes through a center hole in the cylindrical plate and is dispersed to the atmosphere using multiple pressure relief openings in the cylindrical plate. The air pressure in the gap between the chuck surface and the back side of the wafer supports the wafer against its tendency to sag due to its own weight and the effects of rapid rotation. This edge handling chuck design provides acceptable chuck performance at rotation speeds up to about 1500 rpm. An edge handling chuck is often desirable since it typically produces less particle contamination than chucks that secure the wafer by forces exerted on the wafer backside. Edge handling chucks can also provide better control of wafer flatness for a more uniform depth of focus across the wafer surface.

For current wafer inspection systems it is desirable to maintain a stable surface for rotation speeds up to and greater than approximately 2250 rpm. The airflow supply rate typically increases 4 to 5 times to provide enough wafer support at this speed of rotation. The increased amount of air and higher air velocities may deform the wafer and cause the loss of thousands of particles, which contaminate the back surface of the wafer way above an acceptable level. Future applications may require even higher rotation rates, perhaps as great as 3000 rpm or even greater.

It is within this context that embodiments of the present invention arise.

BRIEF DESCRIPTION OF THE DRAWINGS

Objects and advantages of the invention will become apparent upon reading the following detailed description and upon reference to the accompanying drawings in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Prior art edge handling chucks followed the path of conventional air bearing systems and ignored the dynamics of a spinning vortex in the gap between the top flat surface of chuck cylindrical plate and the wafer back surface. Embodiments of the present invention, by contrast, consider these effects in the design of the chuck surface.

Figure 1A:
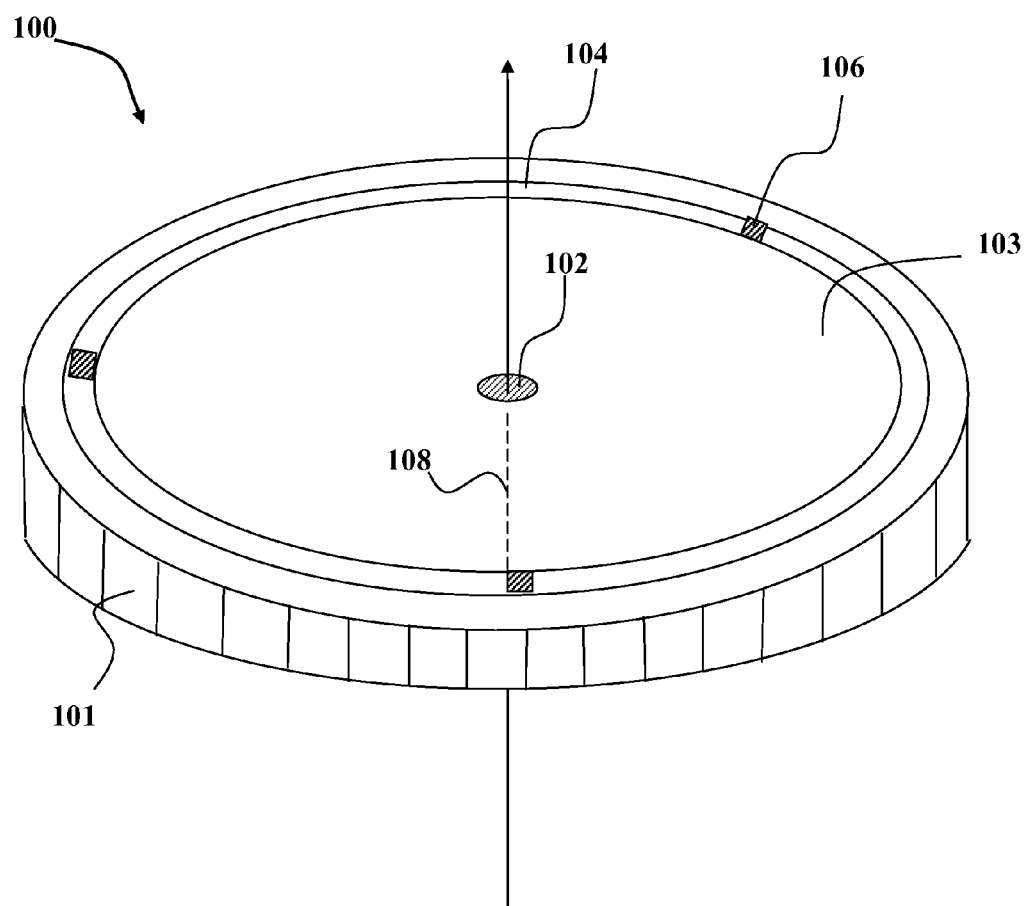
FIG. 1A is a perspective view of an edge handling chuck according to an embodiment according to an embodiment of the present invention.

FIG. 1A is a perspective view illustrating an edge handling chuck in according to an embodiment of the present invention. As shown in FIG. 1, the edge handling chuck 100 includes a plate 101 for holding a test substrate, such as a semiconductor wafer, with a plurality of edge clamps 106 positioned at a periphery of the plate 101 and a support ring 104 located on the plate 101. The plurality of the clamps 106 and the support ring 104 are adapted to maintain the test substrate in a relatively fixed orientation with respect to the chuck 100 during its rotation. The cylindrical plate 101, clamps 106 and support ring 104 may be sized to accommodate a particular size semiconductor wafer. By way of example, the cylindrical plate 101, clamps 106 and support ring 104 may be sized to accommodate a wafer having a diameter of about 300 millimeters or more.

The plate 101 has a central axis 108 and a fluid (e.g., gas) opening 102 located in the middle of the plate 101. The fluid opening 102 is aligned with the central axis 108. A top surface 103 of the plate 101 has a varied topography characterized by symmetry about the central axis 108. The topography of the top surface 103 is designed to result in a reduced fluid volume flow rate required to support a wafer during rotation of the plate 101. In particular, the topography is chosen such that a volume flow rate for fluid flowing between the fluid opening and a periphery of the top surface to counteract a sagging tendency of a substrate is significantly less than a volume flow rate needed for a similar but flat-surfaced edge handling chuck to similarly counteract the sagging tendency of the substrate.

As used herein, volume fluid (e.g., gas) flow rate would be significantly less, if, at a given rate of rotation and amount of wafer sag, the flow needed rate to counteract the sag to a given degree of flatness with a profiled plate surface is below a threshold for generation of unacceptable particle contamination and the flow rate for a flat-surfaced plate of similar dimensions to similarly counteract the sagging of the same wafer would be above the threshold.

By way of example and without limitation, with careful choice of the topography the volume flow rate for fluid flowing between the fluid opening and a periphery of the top surface to counteract a sagging tendency of a substrate may be, e.g., less than on third of the volume flow rate needed for a similar but flat-surfaced edge handling chuck to similarly counteract the sagging tendency of the substrate.

Figure 1B:
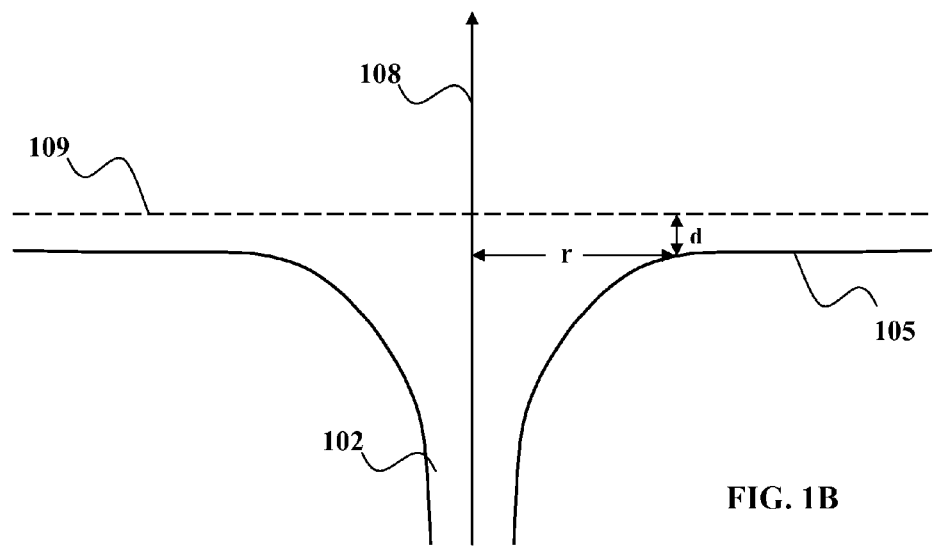
FIGS. 1B-1C are cross-sectional views illustrating the alternative topographies of the top surface of the edge handling chuck according to an embodiment of the present invention.
Figure 1C:
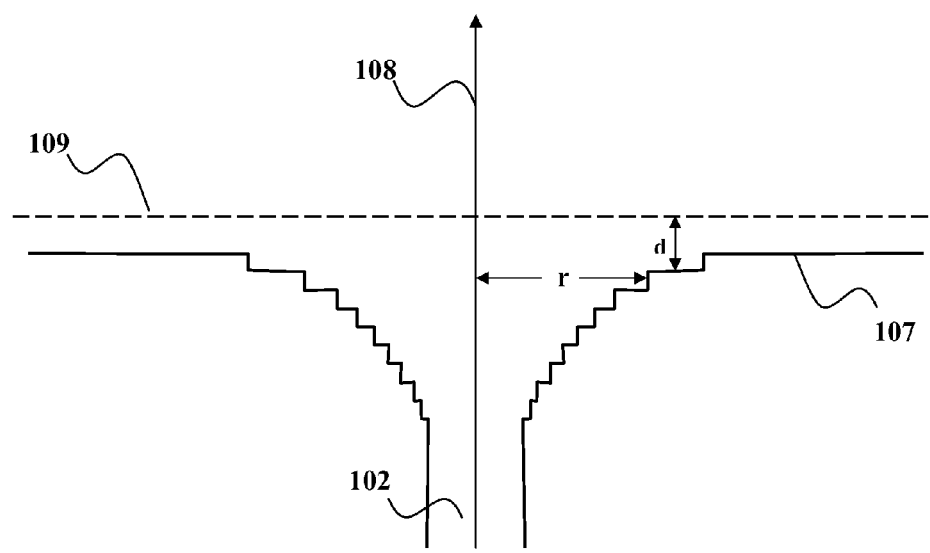

FIGS. 1B-1C are cross-sectional views illustrating alternative topographies of the top surface 103 of the edge handling chuck 100. FIG. 1B illustrates a smooth topography and FIG. 1C shows a stepped topography of the top surface 103 of the edge handling chuck 100. As shown in FIGS. 1B-1C, a distance d between the top surface 103 and a backside 109 of the test substrate varies inversely with respect to radial distance r from the central axis 108, over some region of the chuck surface. The top surface 103 may be substantially flat proximate the periphery of the cylindrical plate 101.

With such topographies of the top surface 103, a volume flow rate of the fluid flowing between the fluid opening 102 and a periphery of the top surface 103 is less than or equal to about one third of a volume flow rate needed for a similar but flat-surfaced edge handling chuck to counteract the sagging tendency of the substrate. For example, for a rotation speed of about 1500 rpm, a fluid flow rate of about 10 L/min is required for a flat-surfaced edge handling chuck to support a 300-mm wafer. By contrast, an edge handling chuck 100 of the type shown in FIGS. 1A-1B requires about 2.5 L/min to 3 L/min to provide similar sufficient support for the wafer during rotation at about 1500 rpm. Specifically, for a rotation speed of about 2250 rpm, a flat-surfaced edge handling chuck requires a fluid flow rate of about 22 L/min to counteract the sagging tendency of the wafer during the rotation. The edge handling chuck 100 with the varied topography top surface 103, by contrast only requires about 7 L/min to similarly support the wafer during rotation at 2250 rpm. Reducing of the required fluid flow rate reduces wafer shape distortion, and improves chuck damping capabilities at a rotation speed up to and greater than 2250 rpm. The reduced fluid flow rate significantly reduces wafer backside contamination by air flown particles It is noted that with appropriate design of the profile of the top surface 103 the chuck 100 may be able to handle large, e.g., 300-mm wafers, at rotations speeds up to 3000 rpm or even greater using gas flow rates that are below a threshold for unacceptable particle generation.

The varied topography of the top surface of the edge handling chuck 100 as described above in FIGS. 1B-1C may be engineered to result in a radial flow of fluid flowing from the fluid opening 102 to a periphery of the cylindrical plate 101 in a space between the top surface 103 and the backside 109 of the test substrate supported by the chuck 100 characterized by a radial flow velocity that is substantially constant as a function of radial distance r from the central axis 108. "Substantially constant" radial flow velocity of the fluid means that the radial velocity of the fluid does not vary significantly with respect to the radial distance from the central axis when comparing with the variation of the radial flow velocity of the fluid in a flat-surfaced edge handling chuck. A variation of less than about a factor of two is not a significant variation for the purposes of embodiments of the present invention as may be seen from FIG. 4.

Figure 2A:
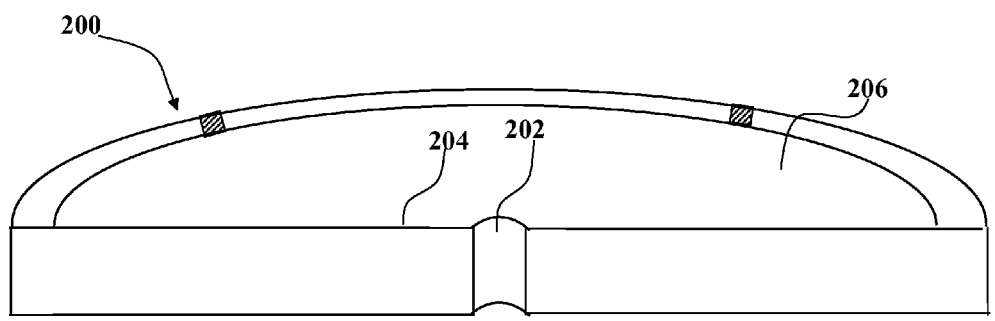
FIG. 2A illustrates a cross-sectional view of a portion of an edge handling chuck of the prior art.
Figure 2B:
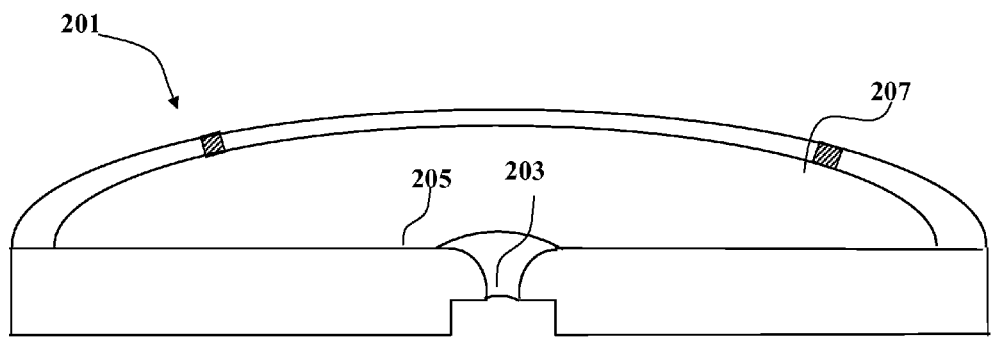
FIG. 2B illustrates a cross-sectional view of an edge handling chuck according to an embodiment of the present invention.

A comparison of the variation of the radial flow velocity of the fluid flowing in a space between the top surface of the chuck and the backside of the test substrate between the prior art edge handling chuck and the edge handling chuck of the present invention may be seen from FIGS. 2A-2B and FIGS. 3A-3B. In particular, FIGS. 2A-2B are cross-sectional views of a flat-surfaced edge handling chuck 200 of the prior art and a varied topography top surface of an edge handling chuck 201 of the present invention respectively. The flat-surfaced edge handling chuck 200 includes a cylindrical plate 206 that has a fluid opening 202 and a flat top surface 204. The varied topography edge handling chuck 201 consists of a cylindrical plate 207 that has a fluid opening 203 and a varied topography top surface 205.

Figure 3A:
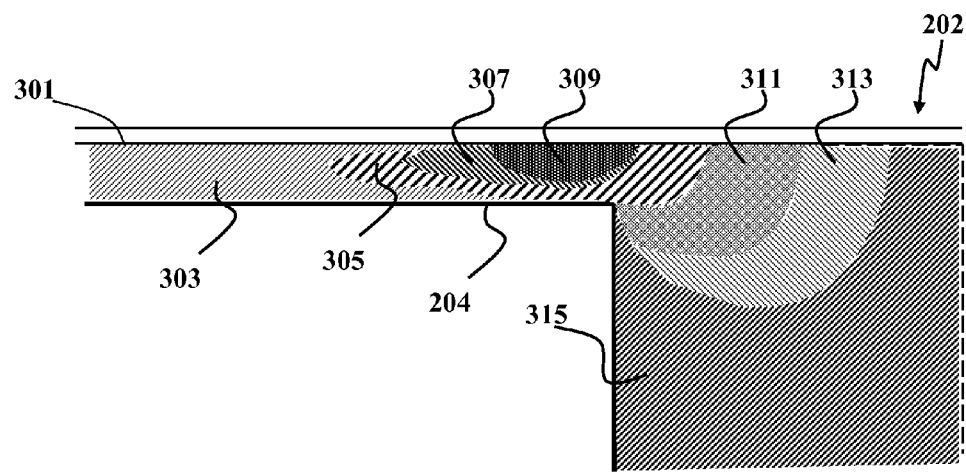
FIG. 3A is a partial cross-sectional view illustrating the air flow velocity in radial direction in the gap between the chuck top surface and the wafer back side of a prior art edge handling chuck.

FIG. 3A is a partial cross-sectional view illustrating radial air flow velocity distribution in a prior art flat-surfaced edge handling chuck 200 described in FIG. 2A. Air flows from the fluid opening 202 to a periphery of the cylindrical plate 206 in a space between the flat top surface 204 and the backside 300 of a semiconductor wafer. As shown in FIG. 3A, the radial air flow velocity in the region 315 is about 195 inch/sec; the radial air flow velocity in the region 313 is about 427 inch/sec, the radial air flow velocity in the region 311 is about 659 inch/sec; the radial air flow velocity in the region 303 is about 890 inch/sec; the radial air flow velocity in the region 305 is about 1122 inch/sec; the radial air flow velocity in the region 307 is about 1586 inch/sec; and the radial air flow velocity in the region 309 is about 2050 inch/sec.

Figure 3B:
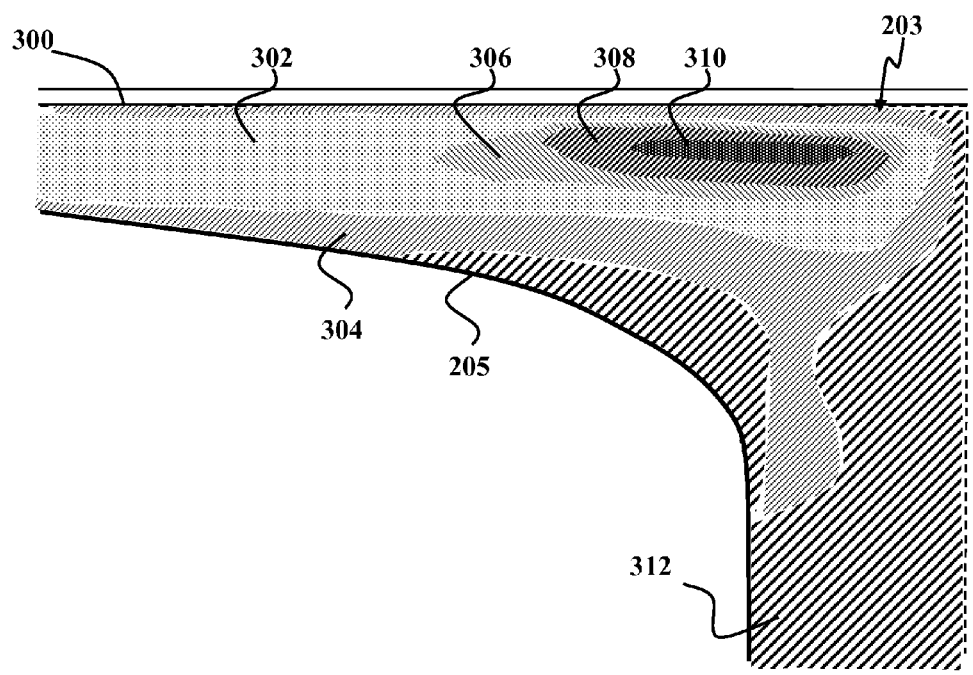
FIG. 3B is a partial cross-sectional view illustrating the air flow velocity in radial direction in the gap between the chuck top surface and the wafer backside of an edge handling chuck according to an embodiment of the present invention.

FIG. 3B is a partial cross-sectional view illustrating radial air flow velocity distribution in the edge handling chuck 201 of the present invention. Similarly, air flows from the fluid opening 203 to a periphery of the cylindrical plate 207 in a space between the top surface 205 and the backside 301 of a semiconductor wafer. As Shown in FIG. 3B, the air flow velocity of region 312 is about 4.5 inch/sec; the air flow velocity of region 304 is about 20 inch/sec; the air flow velocity of region 302 is about 35 inch/sec; the air flow velocity of region 306 is about 66 inch/sec; the air flow velocity of region 308 is about 96 inch/sec; the air flow velocity of region 310 is about 127 inch/sec. The rotation speed of the chuck is the same for FIGS. 3A and 3B. Note that to provide suitable wafer support the maximum radial air flow velocity with the varied topography chuck surface is about one sixteenth of that for the flat chuck surface.

Figure 4:
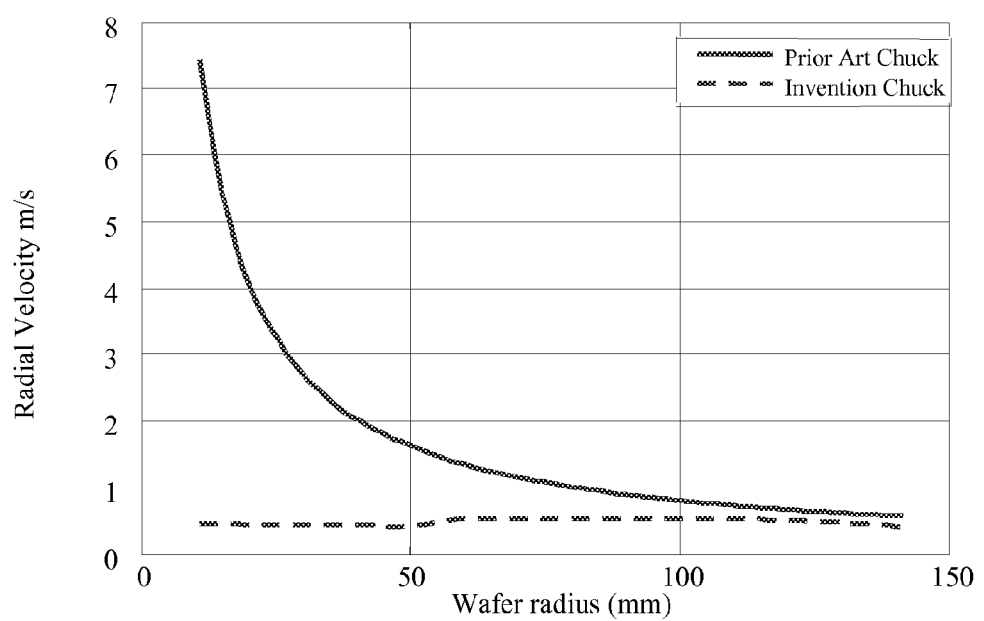
FIG. 4 is a graph illustrating the air flow radial velocity profiles of a prior art edge handling chuck and an edge handling chuck according to an embodiment of the present invention.

FIG. 4 is a graph illustrating the radial air flow velocity profiles with respect to the wafer radius of the prior art flat top surface edge handling chuck and the varied topography top surface edge handling chuck of the present invention. As shown in FIG. 4, the air flow velocity of the flat top surface chuck is extremely high at the center of the wafer and rapidly drops with respect to the radial distance from the center of the wafer to the periphery of the wafer. In this example, the radial velocity for the flat-surfaced chuck drops by about a factor of 10 between a radius of about 10 mm and a radius of about 140 mm. By contrast, the air flow velocity of the varied topography top surface chuck is substantially constant as a function of radial distance from the center of the wafer. Note that for the varied topography surface chuck the radial velocity at a radius of 10 mm is roughly equal to the radial velocity at 140 mm. In between, the radial velocity varies by less than a factor of two.

Figure 5A:
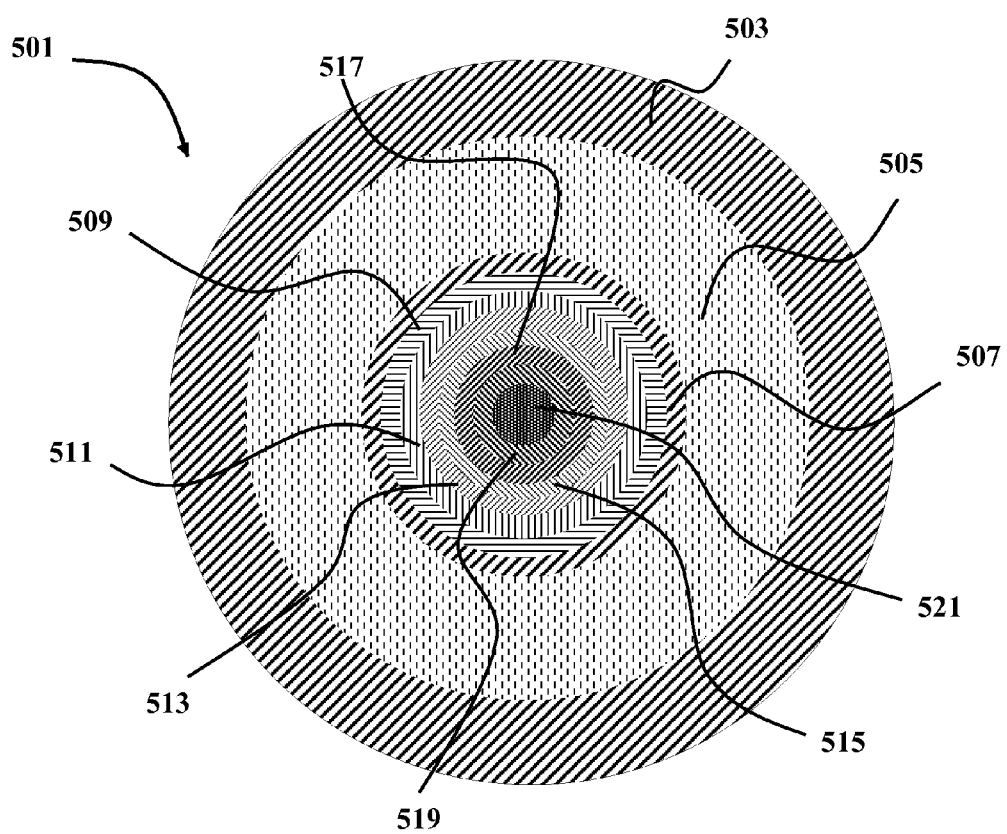
FIGS. 5A-5B are top views illustrating wafer out-of-plane displacement at 2350 rpm and 1500 rpm respectively with an air flow rate of about 3.5 L/min for an edge handling chuck according to an embodiment of the present invention.
Figure 5B:
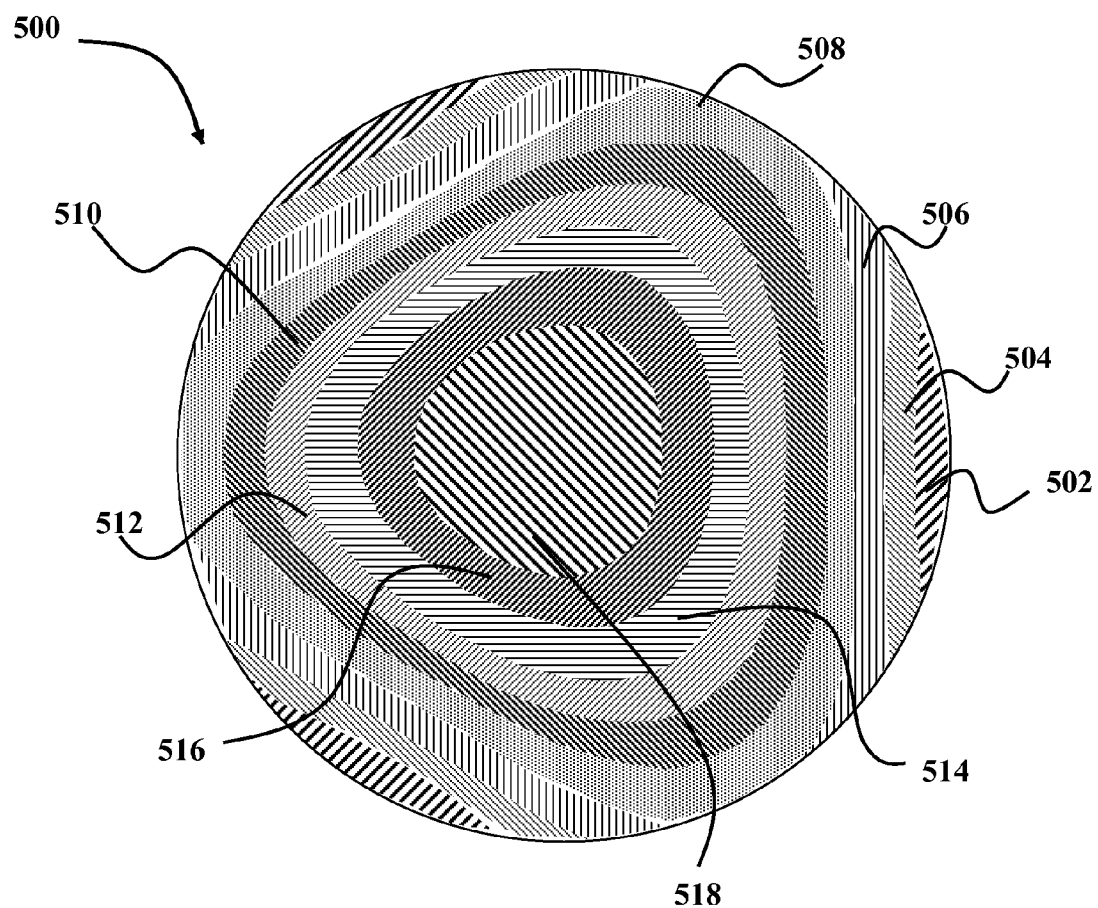

FIGS. 5A-5B are top views illustrating computer simulations of the semiconductor wafer out-of-plane displacement at two different rotation speeds of the edge handling chuck with the same air flow rate. FIG. 5A shows the wafer out-of-plane displacement at a chuck rotation speed of 2350 rpm with an air flow rate of 3.5 L/min. As shown in FIG. 5A, the wafer is out-of-plane by about −2 microns in the regions 521 and 519, about −1.7 micron in the region 517, about −1.3 micron in the region 515, about −0.90 micron in region 513, about −0.49 micron in region 511, about −0.079 micron in region 509, about +0.33 micron in the regions 507 and 503, and about +0.74 micron in the region 505.

FIG. 5B computer simulations of the wafer out-of-plane displacement at a chuck rotation speed of 1500 rpm with the air flow rate of 3.5 L/min. As shown in FIG. 5B, the wafer is out-of-plane about +7.6 micron in region 502, about +16 micron in region 504, about +24 micron in region 506, about +33 micron in region 508, about +41 micron in region 510, about +49 micron in region 512, about +57 micron in the region 514, about +0.66E-04 micron in region 516 and about +74 microns in region 518.

Figure 6:
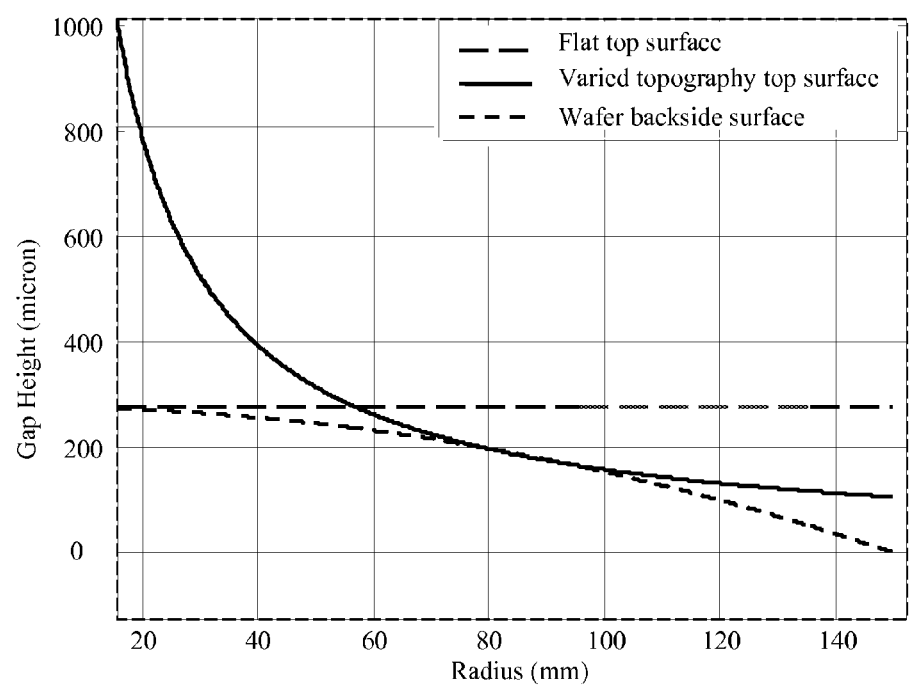
FIG. 6 is a graph illustrating the profiles the flat top surface of the prior art chuck, the varied topography top surface of an edge handling chuck according to an embodiment of the present invention and the wafer backside surface.

The varied topography top surface of the edge handling chuck also minimizes an air gap between the chuck top surface and the substrate held by the chuck. Typically, the air gap height drops to about one half of the air gap with a flat-surfaced chuck. The reduction in air gap height considerably increases air bearing damping capability because damping is proportional to the inverse of air gap height raised to the third power. Improved air bearing damping is advantageous in that it reduces vibration that could otherwise result in inconsistent beam focus and positioning (in case of oblique illumination) and consequently reduce system performance. FIG. 6 is a graph illustrating the surface profiles of the flat top surface chuck, the varied topography top surface chuck and the warped wafer backside surface. As shown in FIG. 6, the air gap height between the varied topography top surface of the chuck and the backside surface of the wafer is less than the air gap height between the flat top surface of the chuck and the backside surface of the wafer.

Figure 7:
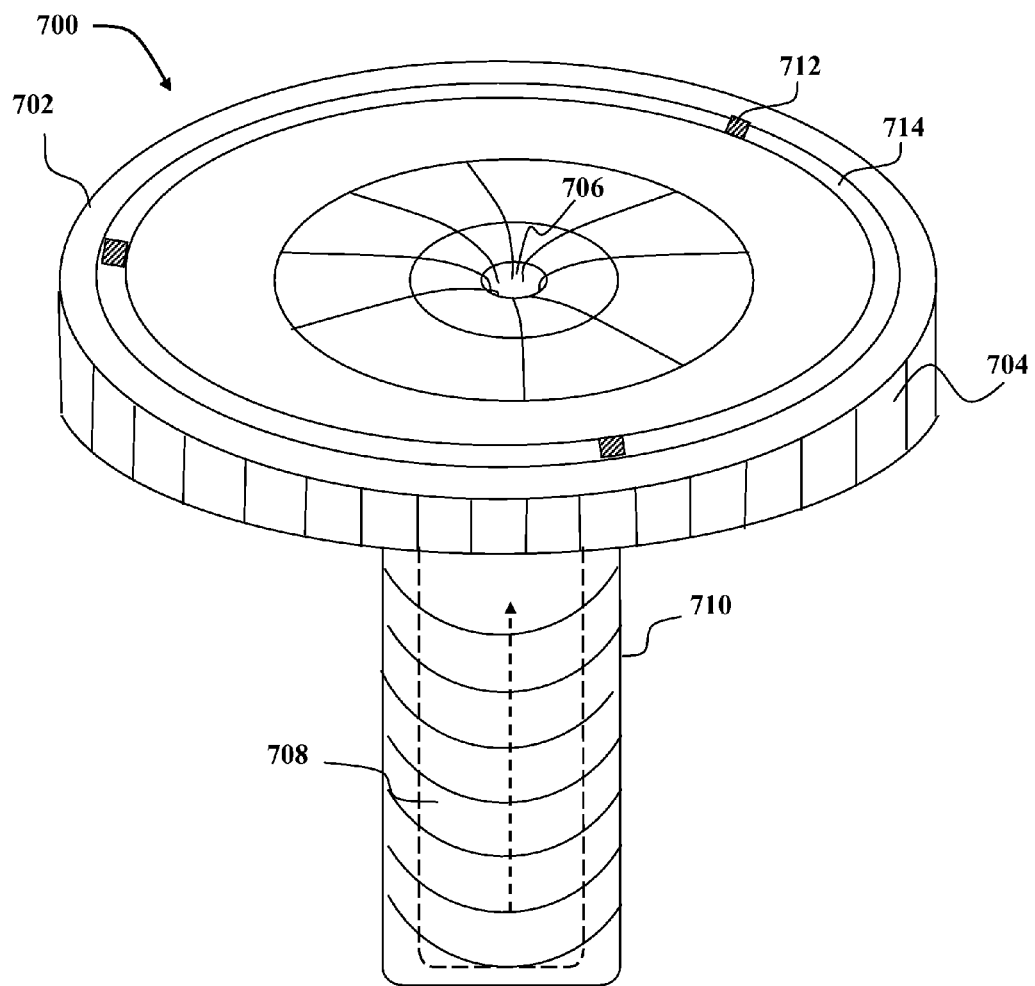
FIG. 7 is a perspective view of a system for holding and rotating a test substrate at a high speed according to another embodiment of the present invention.

The edge handling chuck described above with respect to FIGS. 1A-1C may be employed in a system for holding and rotating a test substrate at a high rotation speed, such as a system for inspecting the surface of a semiconductor wafer. FIG. 7 is a perspective view illustrating an edge handling chuck system according to another embodiment of the present invention. As shown in FIG. 7, system 700 include edge handling chuck 702 of the type described in FIGS. 1A-1C, which consists of a more or less cylindrical plate 704 having a central axis, a fluid opening 706 located in the middle of the cylindrical plate 704, and a top surface having a varied topography characterized by symmetry about the central axis. As an alternative to a single central fluid opening 706, two or more fluid opening may be located off-center, e.g., in a symmetrical arrangement about the central axis. A fluid application system 708 supplies a fluid, e.g., a gas, through the fluid opening 706 to a gap space between the top surface of the plate 704 and a back surface of a substrate hold by the edge handling chuck 702 to support the substrate against the tendency to be sag during the high speed rotation. A spindle drive motor 710 rotates the plate 704. Examples of suitable gases include Air (CDA), Nitrogen, and most inert gases having a kinematic viscosity coefficient close to that of air. If the kinematic viscosity coefficient is significantly different, it may be desirable to recalculate the profile of the topography of the top surface of the plate 704.

A substrate (e.g., a semiconductor wafer) is held to the cylindrical plate 704 by a plurality of edge clamps 712 located at a periphery of the cylindrical plate and a support ring 714 located on the cylindrical plate. The edge clamps 712 are adapted to maintain the wafer in a relatively fixed orientation with respect to the chuck during rotation of the chuck. The edge handling chuck rotates at high rotation speed while a fluid flow is simultaneously dispersed into a gap space between a top surface of the edge handling chuck and a back surface of the substrate to counteract a tendency of the substrate to sag during rotation. The air flow rate may be adjusted to keep the substrate substantially flat at different rotation speeds of the chuck. For example, at a rotation speed of 1500 rpm an air flow rate of about 2.5 L/min to 3 L/min may be required to hold the substrate substantially flat. A rotation speed of 2250 rpm requires an air flow rate of about 7 L/min may be required to keep the chuck substantially flat. These flow rates are about one third the flow rate required to similarly support a wafer using an edge handling chuck with a conventional flat top surface. The reduced air flow rate reduces the generation of particles. It is noted that particle generation is not linear with respect to flow rate. There is a threshold flow rate below which relatively few particles are generated. Above this threshold generation of particles may be significant. Thus a reduction in flow rate by a factor of about one third may have a dramatic impact on the generation of particles, particularly if the reduced flow rate lies below the threshold.

Embodiments of the present invention may implement reduced flow rate during chuck rotation without having to modify parts of a wafer inspection system other than the chuck. Therefore, existing wafer inspection systems that use edge handling chucks may be upgraded simply by replacing the existing chuck plate with one having a profiled surface of the type described herein. Such a solution to particle generation is relatively easy and inexpensive to implement on an existing edge handling chuck system by replacing a flat-surfaced plate with one having a surface with varied topography as described herein.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. An edge-handling chuck comprising,
a plate having a central axis, the plate having:

a fluid opening located in the plate; and a top surface having a varied topography characterized by symmetry about the central axis, wherein the topography is such that a volume flow rate for fluid flowing between the fluid opening and a periphery of the top surface to counteract a sagging tendency of a substrate is significantly less than a volume flow rate needed for a similar but flat-surfaced edge handling chuck to similarly counteract the sagging tendency of the substrate.

2. The edge-handling chuck of claim 1 wherein the topography of the top surface is chosen such that a radial flow velocity for fluid flowing from the fluid opening to a periphery of the plate in a space between the top surface and the substrate supported by the chuck is substantially constant as a function of radial distance from the central axis.

3. The edge-handling chuck of claim 1, wherein the topography is such that a distance d between the top surface and a backside of the substrate varies inversely with respect to radial distance from the central axis over some region of the chuck surface.

4. The edge-handling chuck of claim 3, wherein the topography includes a substantially flat region proximate the periphery of the chuck.

5. The edge-handling chuck of claim 1 further comprising a plurality of edge clamps at a periphery of the plate and a support ring located on the plate, wherein the plurality of the clamps and the support ring are adapted to maintain the substrate in a relatively fixed orientation with respect to the chuck during rotation of the chuck.

6. The edge-handling chuck of claim 5, wherein the plate, clamps and support ring are sized to accommodate a semiconductor wafer having a diameter of about 300 millimeters or more.

7. The edge-handling chuck of claim 1, wherein the topography is a smooth topography.

8. The edge-handling chuck of claim 1, wherein the topography is a stepped topography.

9. A system for holding and rotating a test substrate at a high speed comprising:

an edge-handling chuck including a plate having a central axis, the plate having:

a fluid opening located in the middle of the cylindrical plate; and a top surface having a varied topography characterized by symmetry about the central axis, wherein the topography is such that a volume flow rate for gas flowing between the fluid opening and a periphery of the top surface needed to counteract a sagging tendency of the substrate is substantially less than a volume flow rate needed for a similar but flat-surfaced edge handling chuck to similarly counteract the sagging tendency of the substrate;

a gas system adapted to supply gas through the fluid opening to a gap space between the top surface and a back surface of the substrate, wherein the fluid pressure supports the test substrate against the tendency to sag during the high speed rotation; and a spindle drive motor adapted to impart rotary motion to the edge-handling chuck about the central axis.

10. The system of claim 9 wherein the varied topography of the top surface is chosen such that a radial flow velocity for fluid flowing from the fluid opening to a periphery of the plate in a space between the top surface and a substrate supported by the edge-handling chuck is substantially constant as a function of radial distance from the fluid opening.

11. The system of claim 9, wherein the varied topography is such that a distance d between the top surface and a backside of the substrate varies inversely with respect to radial distance from the axis over some region of the top surface.

12. The system of claim 11, wherein the varied topography includes a substantially flat region proximate the periphery of the plate.

13. The system of claim 9 further comprising a plurality of edge clamps at a periphery of the cylindrical plate and a support ring located on the plate, wherein the plurality of the clamps and the support ring are adapted to maintain the substrate in a relatively fixed orientation with respect to the chuck during rotation of the chuck.

14. The system of claim 13, wherein the plate, clamps and support ring are sized to accommodate a semiconductor wafer having a diameter of about 300 millimeters or more.

15. A method for chucking a rotating substrate, comprising:

holding the substrate with an edge-handling chuck;

rotating the edge handling chuck and the substrate at a high rotation speed; and dispersing a fluid flow to a gap space between a top surface of the edge handling chuck and a back surface of the substrate to counteract a tendency of the substrate to sag during rotation, wherein a radial velocity of the fluid is approximately constant through the gap space between the top surface of the edge handling chuck and the back surface of the test substrate.

16. The method of claim 15 wherein the rotation speed is equal or greater than about 1500 rpm.

17. The method of claim 15 wherein the rotation speed is equal or greater than about 2250 rpm.

18. The method of claim 15 wherein the rotation speed is equal or greater than about 3000 rpm.

19. The method of claim 15 wherein the test substrate is a semiconductor wafer having a diameter of about 300 millimeters or more.

* * * * *